United States Patent
Wang et al.

(10) Patent No.: US 12,550,294 B2
(45) Date of Patent: Feb. 10, 2026

(54) LIQUID COOLING CLEANING VALVE

(71) Applicant: Quanta Computer Inc., Taoyuan (TW)

(72) Inventors: Wei-Te Wang, Taoyuan (TW);
Ming-Hung Tsai, Taoyuan (TW);
Bo-Cheng Ciou, Taoyuan (TW);
Jen-Mao Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 245 days.

(21) Appl. No.: 18/298,725

(22) Filed: Apr. 11, 2023

(65) Prior Publication Data
US 2024/0237282 A1    Jul. 11, 2024

Related U.S. Application Data

(60) Provisional application No. 63/478,801, filed on Jan. 6, 2023.

(51) Int. Cl.
*H05K 7/20* (2006.01)

(52) U.S. Cl.
CPC ..... *H05K 7/20272* (2013.01); *H05K 7/20254* (2013.01); *H05K 7/20263* (2013.01); *H05K 7/20772* (2013.01); *H05K 7/20781* (2013.01)

(58) Field of Classification Search
CPC ........... H05K 7/20254; H05K 7/20272; H05K 7/20772; G06F 1/20
See application file for complete search history.

(56) References Cited

U.S. PATENT DOCUMENTS

| | | | |
|---|---|---|---|
| 12,150,274 B2 * | 11/2024 | Tseng | H05K 7/20272 |
| 2019/0249939 A1 * | 8/2019 | Otsuki | F28F 19/002 |
| 2019/0313553 A1 * | 10/2019 | Robillon | F28F 3/12 |
| 2020/0154610 A1 * | 5/2020 | Wilks | H05K 7/20818 |
| 2022/0377937 A1 * | 11/2022 | Chen | H05K 7/20254 |

FOREIGN PATENT DOCUMENTS

| | | |
|---|---|---|
| CN | 213755512 U | 7/2021 |
| CN | 215647917 U | 1/2022 |
| CN | 114554790 A | 5/2022 |
| TW | I783678 B | 11/2022 |

OTHER PUBLICATIONS

TW Office Action for Application No. 112127086, mailed May 2, 2024, w/ First Office Action Summary, 8 pp.
TW Search Report for Application No. 112127086, mailed May 2, 2024, w/ First Office Action, 1 p.

* cited by examiner

*Primary Examiner* — Zachary Pape
(74) *Attorney, Agent, or Firm* — NIXON PEABODY LLP

(57) ABSTRACT

A liquid cooling system includes a cold plate thermally coupled to a heat-generating electronic component, a heat removal unit fluidly coupled to the cold plate, and a valve fluidly coupled to the cold plate and the heat removal unit. The cold plate has an internal fluid pathway. The heat removal unit delivers the cooling fluid to the cold plate, receives heated cooling fluid from the cold plate, and removes heat from the heated cooling fluid. When the valve is in a first orientation, the cold plate and the heat removal unit are fluidly coupled in a first configuration and the cooling fluid flows through the internal fluid pathway in a first direction. When the valve is in a second orientation, the cold plate and the heat removal unit are fluidly coupled in a second configuration and the cooling fluid flows through the internal fluid pathway in a second direction.

14 Claims, 5 Drawing Sheets

LIQUID COOLING CLEANING VALVE

CROSS-REFERENCE TO RELATED APPLICATIONS

This application claims priority from and the benefit of U.S. Provisional Patent Application Ser. No. 63/478,801, filed on Jan. 6, 2023, titled "Liquid Module Cleaning Itself," which is hereby incorporated by reference herein in its entirety.

FIELD OF THE INVENTION

The present disclosure relates generally to a valve for a liquid cooling system, and more specifically, to a liquid cooling system with a valve configured to adjust the flow path of a cooling fluid that flows through a cold plate of the liquid cooling system.

BACKGROUND OF THE INVENTION

Computing systems include a variety of heat-generating electronic components. Liquid cooling systems can be used to remove heat from these heat-generating electronic components during operation of the computing system. Typical liquid cooling systems include a cold plate through which a cooling fluid can flow, to aid in removing heat from the heat-generating electronic components. However, these cold plates can easily become clogged with debris, such as dirt, dust, etc. It can be costly and time-consuming to remove such cold plates from the computing system. Thus, new systems and methods for cleaning cold plates are needed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, the present disclosure is directed to a liquid cooling system comprising a cold plate, a heat removal unit, and a valve. The cold plate is configured to be thermally coupled to a heat-generating electronic component, and has an internal fluid pathway through which a cooling fluid flows. The heat removal unit is fluidly coupled to the cold plate. The heat removal unit is configured to deliver the cooling fluid to the cold plate, received heated cooling fluid from the cold plate, and remove heat from the heated cooling fluid. The valve is fluidly coupled to the cold plate and the heat removal unit, and is operable between a first orientation and a second orientation. When the valve is in the first orientation, the cold plate and the heat removal unit are fluidly coupled in a first configuration in which the cooling fluid flows through the internal fluid pathway of the cold plate in a first direction. When the valve is in the second orientation, the cold plate and the heat removal unit are fluidly coupled in a second configuration in which the cooling fluid flows through the internal fluid pathway of the cold plate in a second direction that is different than the first direction.

In some aspects of the first implementation, the cold plate includes a first port disposed at a first end of the internal fluid pathway, and a second port disposed at a second end of the internal fluid pathway.

In some aspects of the first implementation, the heat removal unit includes a cold port and a hot port. The heat removal unit is configured to deliver the cooling fluid to the cold plate via the cold port, and to receive the heated cooling fluid from the cold plate via the hot port.

In some aspects of the first implementation, when the valve is in the first orientation, the cold port of the heat removal unit is fluidly coupled to the first port of the cold plate, and the hot port of the heat removal unit is fluidly coupled to the second port of the cold plate In some aspects of the first implementation, when the valve is in the second orientation, the cold port of the heat removal unit is fluidly coupled to the second port of the cold plate, and the hot port of the heat removal unit is fluidly coupled to the first port of the cold plate.

In some aspects of the first implementation, the internal fluid pathway of the cold plate includes a first channel, a second channel, and one or more intermediate channels. The first channel is in fluid communication with the first port. The second channel is in fluid communication with the second port. The one or more intermediate channels in fluid communication with the first channel and the second channel.

In some aspects of the first implementation, when the valve is in the first orientation, the cooling fluid sent from the heat removal unit flows from the first channel to the second channel via the one or more intermediate channels.

In some aspects of the first implementation, when the valve is in the second orientation, the cooling fluid sent from the heat removal unit flows from the second channel to the first channel via the one or more intermediate channels In some aspects of the first implementation, when the valve is in the first orientation, the cooling fluid flows through the one or more intermediate channels in a first direction, and wherein when the valve is in the second orientation, the cooling fluid flows through the one or more intermediate channels in a second direction that is opposite the first direction.

In some aspects of the first implementation, the liquid cooling system is combined with a rack and computing device mounted in the rack. The computing device includes the heat-generating electronic component.

In some aspects of the first implementation, the heat removal unit includes a radiator, one or more heat removal devices, and a fluid pump. The radiator has an input and an output, and is configured to receive the heated cooling fluid from the cold plate and the input and deliver the cooling fluid to the cold plate from the output. The one or more heat removal devices are configured to remove the heat from the heated cooling fluid as the heated cooling fluid flows through the radiator. The fluid pump is configured to cause the cooling fluid to flow into the radiator from the cold plate, through the radiator, and from the radiator to the cold plate.

In a second implementation, the present disclosure is directed to a computing system comprising a rack, a computing device, a cold plate, a heat removal unit, and a valve.

The computing device is mounted in the rack, and includes a heat-generating electronic component. The cold plate is configured to be thermally coupled to a heat-generating electronic component, and has an internal fluid pathway through which a cooling fluid flows. The heat removal unit is mounted in the rack and is fluidly coupled to the cold plate. The heat removal unit is configured to deliver the cooling fluid to the cold plate, received heated cooling fluid from the cold plate, and remove heat from the heated cooling fluid. The valve is fluidly coupled to the cold plate and the heat removal unit, and is operable between a first orientation and a second orientation. When the valve is in the first orientation, the cold plate and the heat removal unit are fluidly coupled in a first configuration in which the cooling fluid flows through the internal fluid pathway of the cold plate in a first direction. When the valve is in the second orientation, the cold plate and the heat removal unit are fluidly coupled in a second configuration in which the cooling fluid flows through the internal fluid pathway of the cold plate in a second direction that is different than the first direction.

In some aspects of the second implementation, the cold plate includes a first port disposed at a first end of the internal fluid pathway, and a second port disposed at a second end of the internal fluid pathway.

In some aspects of the second implementation, the heat removal unit includes a cold port and hot port. The heat removal unit is configured to deliver the cooling fluid to the cold plate via the cold port, and to receive the heated cooling fluid from the cold plate via the hot port.

In some aspects of the second implementation, when the valve is in the first orientation, the cold port of the heat removal unit is fluidly coupled to the first port of the cold plate, and the hot port of the heat removal unit is fluidly coupled to the second port of the cold plate In some aspects of the second implementation, when the valve is in the second orientation, the cold port of the heat removal unit is fluidly coupled to the second port of the cold plate, and the hot port of the heat removal unit is fluidly coupled to the first port of the cold plate.

In some aspects of the second implementation, the internal fluid pathway of the cold plate includes a first channel, a second channel, and one or more intermediate channels. The first channel is in fluid communication with the first port. The second channel is in fluid communication with the second port. The one or more intermediate channels in fluid communication with the first channel and the second channel.

In some aspects of the second implementation, when the valve is in the first orientation, the cooling fluid sent from the heat removal unit flows from the first channel to the second channel via the one or more intermediate channels.

In some aspects of the second implementation, when the valve is in the second orientation, the cooling fluid sent from the heat removal unit flows from the second channel to the first channel via the one or more intermediate channels In some aspects of the second implementation, when the valve is in the first orientation, the cooling fluid flows through the one or more intermediate channels in a first direction, and wherein when the valve is in the second orientation, the cooling fluid flows through the one or more intermediate channels in a second direction that is opposite the first direction.

In some aspects of the second implementation, the heat removal unit includes a radiator, one or more heat removal devices, and a fluid pump. The radiator has an input and an output. The radiator is configured to receive the heated cooling fluid from the cold plate at the input, and deliver the cooling fluid to the cold plate from the output. The one or more heat removal devices are configured to remove the heat from the heated cooling fluid as the heated cooling fluid flows through the radiator. The fluid pump is configured to cause the cooling fluid to flow into the radiator from the cold plate, through the radiator, and from the radiator to the cold plate.

In a third implementation, the present disclosure is directed to a liquid cooling system comprising a plurality of cold plates, a first manifold, a second manifold, a heat removal unit, and a valve. Each of the plurality of cold plates is configured to be thermally coupled to at least one of one or more heat-generating electronic components, and has an internal fluid pathway through which a cooling fluid flows. The first manifold is fluidly coupled to a first end of the internal fluid pathway of each of the plurality of cold plates. The second manifold is fluidly coupled to a second end of the internal fluid pathway of each of the plurality of cold plates. The heat removal unit is fluidly coupled to the plurality of cold plates and is configured to deliver the cooling fluid to the plurality of cold plates, receive heated cooling fluid from the plurality of cold plates, and remove heat from the heated cooling fluid. The valve is fluidly coupled to the first manifold and the second manifold, and is operable between a first orientation and a second orientation. When the valve is in the first orientation, the heat removal unit delivers the cooling fluid to the plurality of cold plates via the first manifold and receives the heated cooling fluid from the plurality of cold plates via the second manifold, such that the cooling fluid flows through the internal fluid pathway of the cold plate in a first direction. When the valve is in the second orientation, the heat removal unit delivers the cooling fluid to the plurality of cold plates via the second manifold and receives the heated cooling fluid from the plurality of cold plates via the first manifold, such that the cooling fluid flows through the internal fluid pathway of the cold plate in a second direction different than the first direction.

In some aspects of the third implementation, the heat removal unit includes a cold port, a hot port, and a fluid pump. The fluid pump is configured to cause the cooling fluid to be delivered to the plurality of cold plates via the cold port, and to cause the heated cooling fluid to be received from the plurality of cold plates via the hot port.

In some aspects of the third implementation, when the valve is in the first orientation, the fluid pump is configured to cause the cooling fluid to flow from the cold port to the plurality of cold plates through the first manifold, and to cause the heated cooling fluid to flow from the plurality of cold plates to the hot port through the second manifold.

In some aspects of the third implementation, the cooling fluid is configured to flow from the cold port and through the valve prior to flowing through the first manifold.

In some aspects of the third implementation, when the valve is in the second orientation, the fluid pump is configured to cause the cooling fluid to flow from the cold port to the plurality of cold plates through the second manifold, and to cause the heated cooling fluid to flow from the plurality of cold plates to the heat removal unit through the first manifold.

In some aspects of the third implementation, the heated cooling fluid is configured to flow from the first manifold and through the valve prior to flowing to the heat removal unit.

In some aspects of the third implementation, the internal fluid pathway of each of the plurality of cold plates includes a first channel, a second channel, and one or more intermediate channels connecting the first channel and the second channel. Within each of the plurality of cold plates, when the valve is in the first orientation, the cooling fluid flows from the first channel to the second channel through the one or more intermediate channels, and when the valve is in the second orientation, the cooling fluid flows from the second channel to the first channel through the one or more intermediate channels.

In some aspects of the third implementation, the liquid cooling system is combined with a rack and one or more computing devices mounted in the rack. The one or more computing devices include the one or more heat-generating electronic components.

In a fourth implementation, the present disclosure is directed to a method for cooling one or more heat-generating electronic components. The method includes orienting a valve in a first orientation to fluidly couple one or more cold plates and a heat removal unit in a first configuration. The method further includes causing a cooling fluid to flow through an internal fluid pathway of each of the one or more cold plates in a first direction to remove heat from the one or more heat-generating electronic components. The method further includes orienting the valve in a second orientation different from the first orientation to fluidly couple the one or more cold plates and the heat removal unit in a second configuration. The method further includes causing the cooling fluid to flow through the internal fluid pathway of each of the one or more cold plates in a second direction different from the first direction to remove heat from the one or more heat-generating electronic components.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
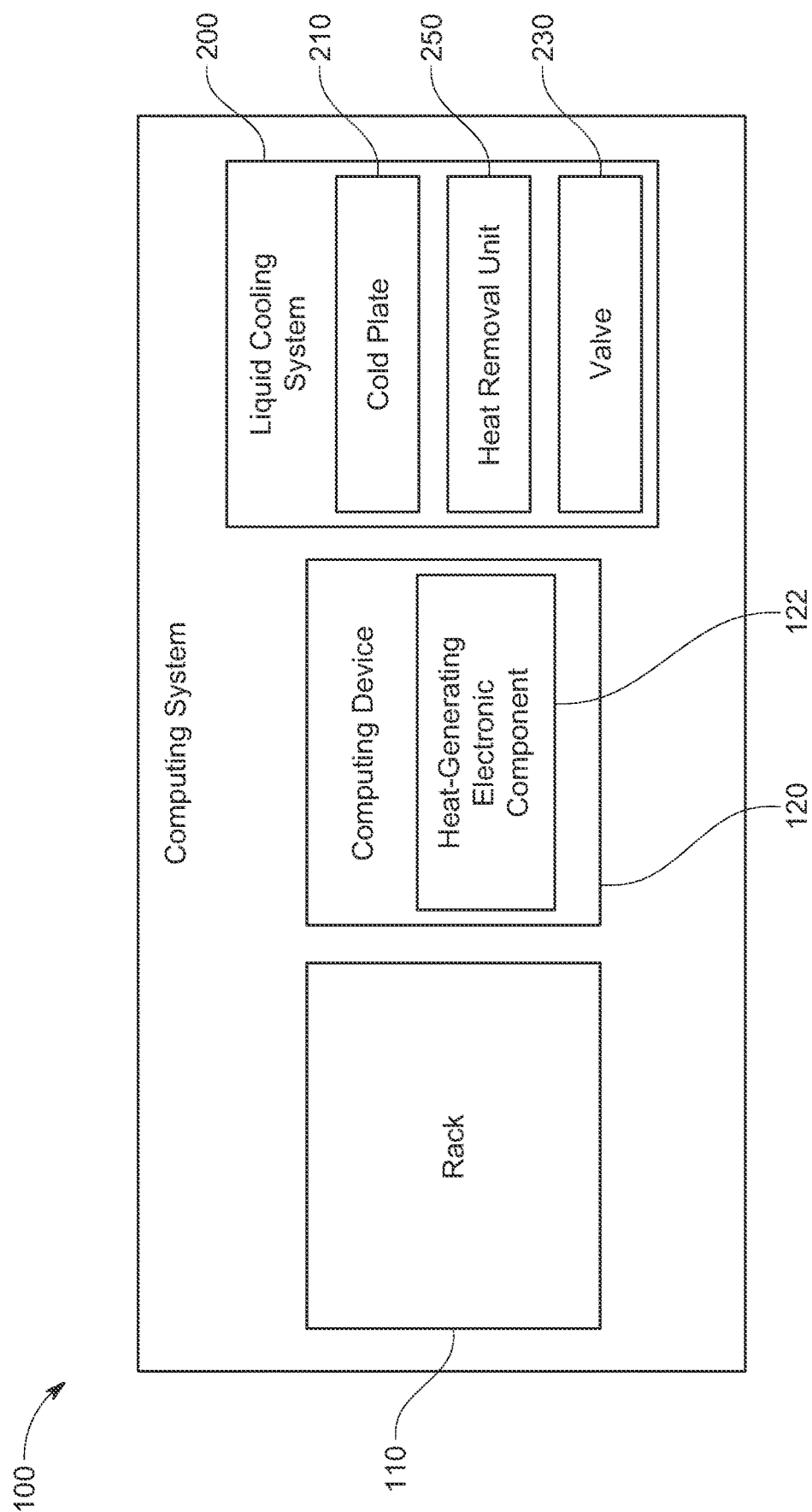
FIG. 1 is a block diagram of a computing system that includes a liquid cooling system and a computing device with a heat-generating electronic component, according to aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 is a block diagram of a computing system 100. The computing system 100 includes a rack 110, a computing device 120, and a liquid cooling system 200. The computing device 120 can be any suitable computing device 120, such as a server (e.g., a tower server, a rack server, a blade server, etc.) or other computing device. The liquid cooling system 200 includes a cold plate 210, a valve 230, and a heat removal unit 250. Generally, any of the components of the liquid cooling system 200 can be mounted in the rack 110. The liquid cooling system 200 can be used to remove heat generated by a heat-generating electronic component 122 of the computing device 120. For example, the cold plate 210 of the liquid cooling system 200 can be in thermal communication with the heat-generating electronic component 122 in order to remove heat from the heat-generating electronic component 122. Cooling fluid can be circulated between the cold plate 210 and the heat removal unit 250 through the valve 230, in order to remove heat from the cooling fluid. The cooling fluid can be delivered to the cold plate 210 by the heat removal unit 250 where the cooling fluid absorbs heat from the heat-generating electronic component 122.

The heated cooling fluid can then be received by the heat removal unit 250 from the cold plate 210, where this absorbed heat can be removed from the cooling fluid. The cooling fluid can then again be delivered to the cold plate 210 by the heat removal unit 250. As discussed further herein, the valve 230 is operable between a first orientation and a second orientation. When the valve 230 is in the first orientation, the cold plate 210 and the heat removal unit 250 are fluidly coupled in a first configuration. When the valve 230 is in the second orientation, the cold plate 210 and the heat removal unit 250 are fluidly coupled in a second configuration that is different than the first configuration.

FIG. 2 shows the liquid cooling system 200 when the valve 230 is in a first orientation, and the cold plate 210 is fluidly coupled to the heat removal unit 250 in the first configuration. The cold plate 210 includes an internal fluid pathway that is formed from a first channel 212, a second channel 214, and a plurality of intermediate channels 216A-216F. The intermediate channels 216A-216F connect the first channel 212 to the second channel 214. The cold plate 210 also includes a first port 218A and a second port 218B. Generally, the cold plate 210 will be a three-dimensional block of thermally conductive material. The first channel 212, the second channel 214, and the intermediate channels 216A-216D can be defined partially or wholly within the block of material forming the cold plate 210. The first port 218A is located at the end of the first channel 212 and serves as a connection between the first channel 212 and the external environment. The second port 218B is located at the end of the second channel 214 and serves as a connection between the second channel 214 and the external environment.

The first port 218A and the second port 218B of the cold plate 210 can be fluidly coupled to the valve 230 via a pair of tubes 220A and 220B, and a pair of quick connectors 222A and 222B. One end of the tube 220A is coupled to the first port 218A, and the other end of the tube 220A terminates in the quick connector 222A. Similarly, one end of the tube 220B is coupled to the second port 218B, and the other end of the tube 220B terminates in the quick connector 222B.

During use of the liquid cooling system 200, the cold plate 210 is thermally coupled to the heat-generating electronic component 122. In some implementations, the cold plate 210 physically contacts the heat-generating electronic component 122, but the cold plate 210 could be thermally coupled in other ways. Heat generated by the heat-generating electronic component 122 is absorbed by the material of the cold plate 210. Cooling fluid can then be caused to flow through the internal fluid pathway of the cold plate 210. As the cooling fluid circulates, the cooling fluid absorbs the heat from the cold plate 210 (which was itself absorbed from the heat-generating electronic component 122). The heated cooling fluid can then flow to the heat removal unit 250, which removes heat from the cooling fluid and directs the now-cooled cooling fluid back to the cold plate 210.

The heat removal unit 250 includes a hot port 252A, a radiator 254, heat removal devices 256A-256C, a fluid pump 258, and a cold port 252B. The heat removal unit 250 receives the heated cooling fluid from the cold plate 210 at the hot port 252A. The heated cooling fluid then flows to the radiator 254, which generally includes a large internal fluid pathway that the heated cooling fluid flows through. As the heated cooling fluid flows through the radiator 254, the heat removal devices 256A-256C remove heat from the heated cooling fluid (and/or from the material of the radiator 254, which may absorb some of the heat from the heated cooling fluid). In some implementations, the heat removal devices 256A-256C are fans. However, other types of heat removal devices can also be used. Moreover, while three heat removal devices 256A-256C are shown, any suitable number of heat removal devices can be used.

The fluid pump 258 causes the fluid to circulate within the liquid cooling system 200. During operation, the fluid pump 258 causes the cooling fluid to flow from the cold plate 210 into the radiator 254, through the radiator 254, and from the radiator 254 to the cold plate 210. The fluid pump 258 can be any suitable pump used to circulate fluid. One end of the fluid pump 258 is coupled to the radiator 254, and the other end of the fluid pump 258 is coupled to the cold port 252B. After the heat is removed from the cooling fluid within the radiator 254, the cooled cooling fluid flows out of the heat removal unit 250 at the cold port 252B. While the fluid pump 258 is shown as being coupled between the radiator 254 and the cold port 252B, the fluid pump 258 can generally be located anywhere with the heat removal unit 250, and/or can be located elsewhere within the liquid cooling system 200.

The heat removal unit 250 can be fluidly coupled to the valve 230 via a pair of tubes 240A and 240B, and a pair of quick connectors 242A and 242B. One end of the tube 240A is coupled to the hot port 252A, and the other end of the tube 240A terminates in the quick connector 242A. Similarly, one end of the tube 240B is coupled to the cold port 252B, and the other end of the tube 240B terminates in the quick connector 242B.

The valve 230 includes four ports. Ports 232A and 232B are located on the side of the valve 230 nearest to the cold plate 210, and are used to fluidly couple the valve 230 to the cold plate 210. Ports 234A and 234B are located on the side of the valve 230 nearest to the heat removal unit 250, and are used to fluidly couple the valve 230 to the heat removal unit 250. Port 232A is fluidly connected to the tube 220A via the quick connector 222A, and port 232B is fluidly connected to the tube 220B via the quick connector 222B. Similarly, port 234A is fluidly connected to the tube 240A via the quick connector 242A, and port 234B is fluidly connected to the tube 240B via the quick connector 242B.

While the illustrated implementation shows the use of the tubes 220A, 220B, 240A, and 240B, and the quick connectors 222A, 22B, 242A, and 242B, other implementations of the liquid cooling system 200 may not include these components. For example, the ports 232A and 232B of the valve 230 can be directly connected to the first port 218A and the second port 218B of the cold plate 210 without any intervening components (such as tubes or quick connectors). Similarly, the ports 234A and 234B of the valve 230 can be directly connected to the hot port 252A and the cold port 252B of the heat removal unit 250 without any intervening components (such as tubes or quick connectors).

Figure 2A:
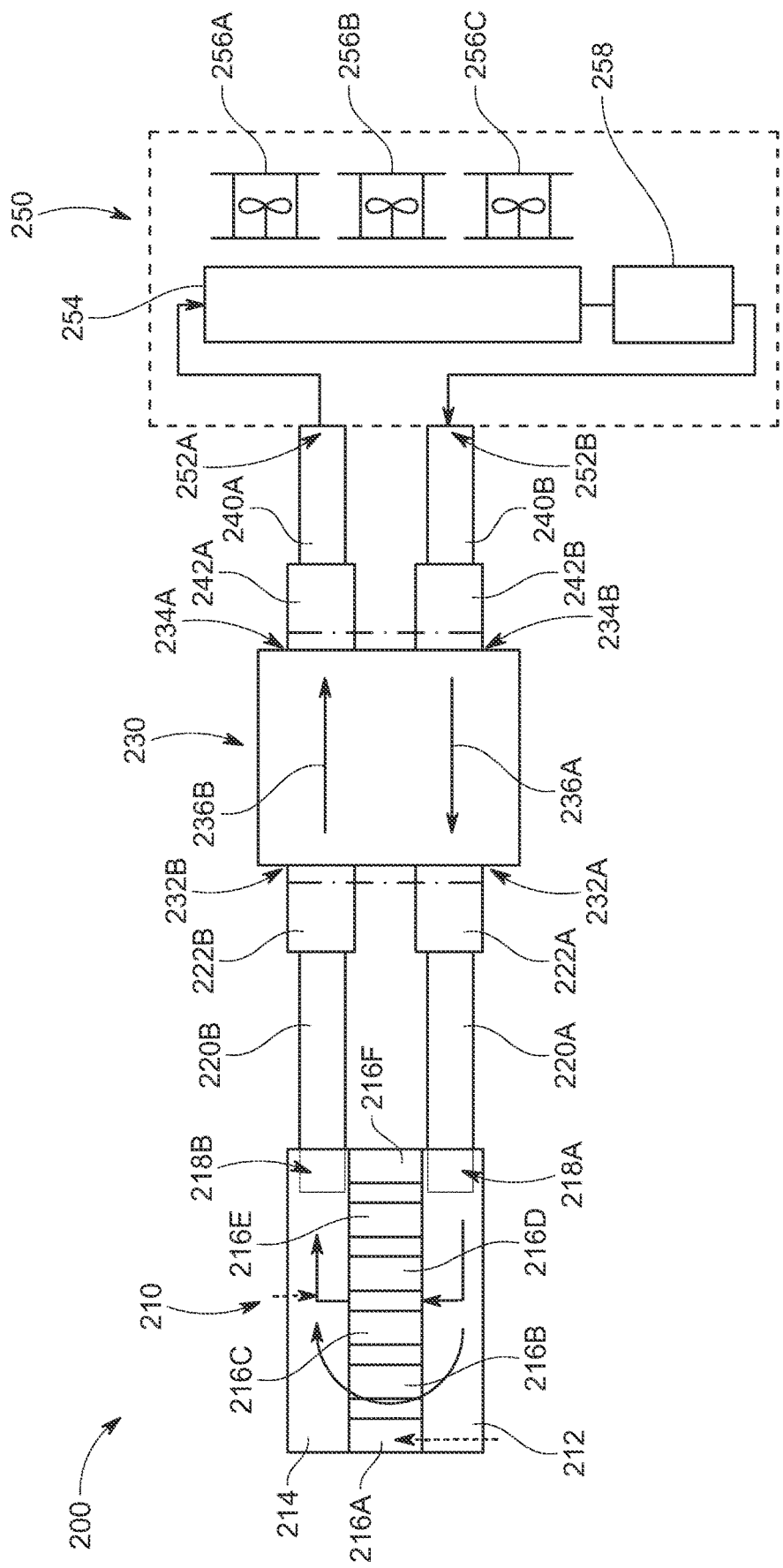
FIG. 2A is a diagram of a first implementation of the liquid cooling system in FIG. 1 when a valve of the liquid cooling system is in a first orientation, according to aspects of the present disclosure.

As noted, the valve 230 is operable between different orientations. In FIG. 2A, the valve 230 is in a first orientation, and the cold plate 210 and the heat removal unit 250 are fluidly coupled in a first configuration. An internal channel 236A of the valve 230 is coupled between port 232A and port 234B of the valve 230, and an internal channel 236B of the valve 230 is coupled between port 232B and port 234A of the valve 230. Because of how the valve 230 is fluidly coupled to the cold plate 210 and the heat removal unit 250, the hot port 252A of the heat removal unit 250 is fluidly coupled to the second port 218B of the cold plate 210, and the cold port 252B of the heat removal unit 250 is fluidly coupled to the first port 218A of the cold plate 210.

When the valve 230 is in the first orientation and the cold plate 210 and the heat removal unit 250 are fluidly coupled in the first configuration, cooling fluid sent from the heat removal unit 250 to the cold plate 210 will initially flow through the first channel 212, then flow in a first direction through the intermediate channels 216A-216F from the first channel 212 to the second channel 214, and finally flow through the second channel 214 and out of the cold plate 210. Thus, when the valve 230 is in the first orientation, the cooling fluid flows through the internal fluid pathway of the cold plate 210 in a first direction (e.g., through the intermediate channels 216A-216F from the first channel 212 to the second channel 214).

During operation of the liquid cooling system 200 when the valve 230 is in the first orientation, the cooling fluid will flow from the first channel 212 to the second channel 214 through the intermediate channels 216A-216F. However, debris can build up within the internal fluid pathway of the cold plate 210. For example, dust, dirt, lint fuzz, etc. can all accumulate within the first channel 212, the second channel 214, and the intermediate channels 216A-216F. The cold plate 210 can be removed from the liquid cooling system 200 to be cleaned. However, such removal can interrupt the performance of the computing system 100.

Figure 2B:
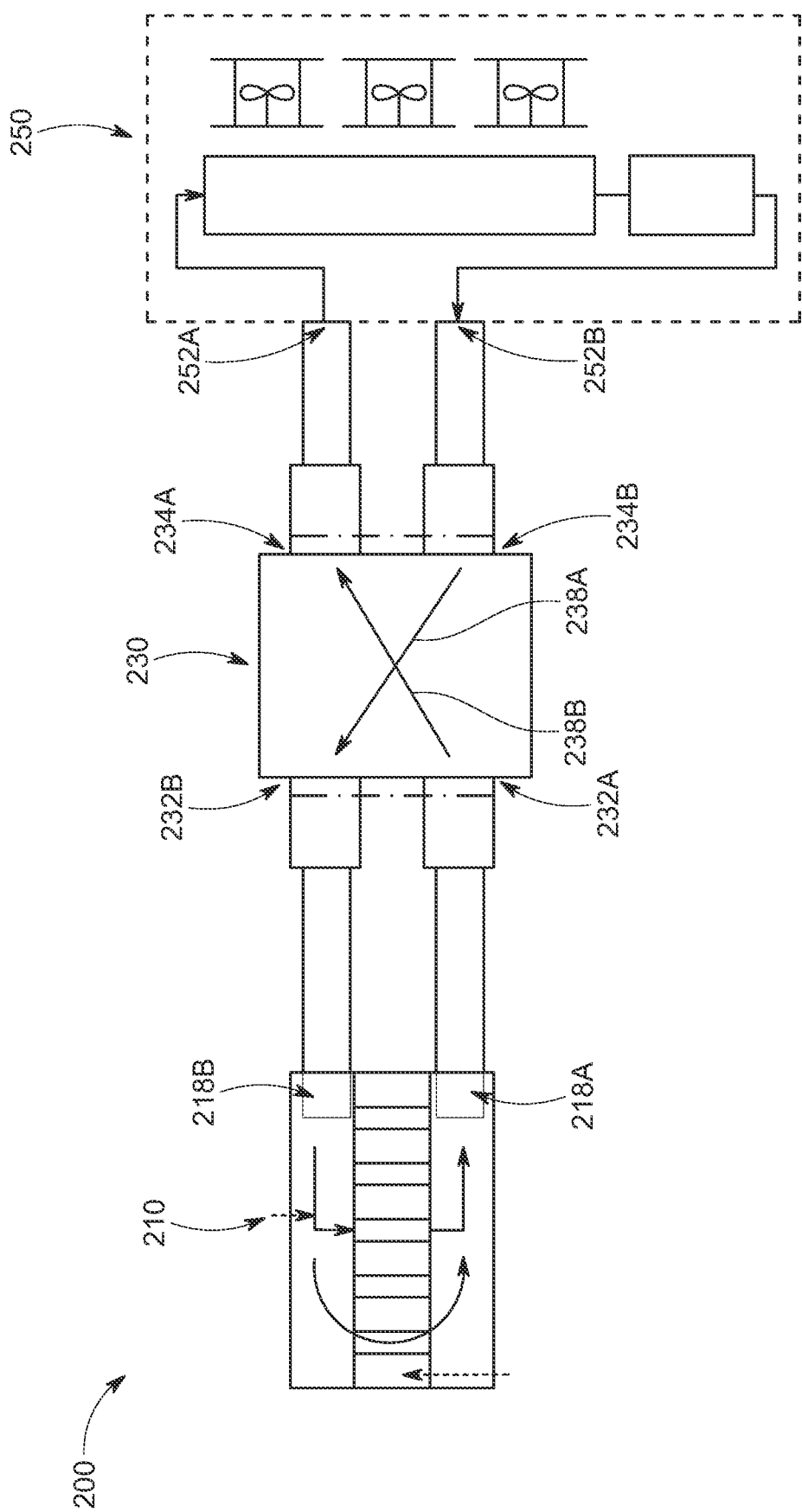
FIG. 2B is a diagram of the first implementation of the liquid cooling system in FIG. 1 when a valve of the liquid cooling system is in a second orientation, according to aspects of the present disclosure.

In FIG. 2B, the valve 230 has been moved from the first orientation to the second orientation and the cold plate 210 and the heat removal unit 250 are coupled in the second configuration. The valve 230 being in the second orientation causes the cooling fluid to flow in the opposite direction through the internal fluid pathway of the cold plate 210. The reversal of the flow direction can remove accumulated debris from within the cold plate 210, so as to clean the cold plate 210 without having to remove it from the liquid cooling system 200.

As shown in FIG. 2B, an internal channel 238A is coupled between the port 234B and the port 232B of the valve 230, and an internal channel 238B is coupled between the port 232A and the port 234A of the valve 230. Because of how the valve 230 is fluidly coupled to the cold plate 210 and the heat removal unit 250, the hot port 252A of the heat removal unit 250 is now fluidly coupled to the first port 218A of the cold plate 210, instead of the second port 218B. Similarly, the cold port 252B of the heat removal unit 250 is now fluidly coupled to the second port 218B of the cold plate 210, instead of the first port 218A.

When the valve 230 is in the second orientation and the cold plate 210 and the heat removal unit 250 are fluidly coupled in the second configuration, cooling fluid sent from the heat removal unit 250 to the cold plate 210 will initially flow through the second channel 214, then flow in a second direction through the intermediate channels 216A-216F from the second channel 214 to the first channel 212, and finally flow through the first channel 212 and out of the cold plate 210. Thus, when the valve 230 is in the second orientation, the cooling fluid flows through the internal fluid pathway of the cold plate 210 in a second direction (e.g., through the intermediate channels 216A-216F from the second channel 214 to the first channel 212).

The valve 230 can generally have any suitable configuration. In some implementations, the two internal channels 236A and 236B that connect the ports 232A, 232B, 234A, and 234B in the first orientation are different channels from the two internal channels 238A and 238B that connect the ports 232A, 232B, 234A, and 234B in the second orientation. Moving between the two orientations can disconnect or disengage the unused set of channels. In other implementations, the internal channels 236A and 236B may be the same channels as the internal channels 238A and 238B, except that moving the valve 230 between the first orientation and the second orientation changes the shape of the channels.

While FIG. 1, FIG. 2A, and FIG. 2B show a liquid cooling system 200 that includes a single cold plate 210 and a single valve 230, other variations on the liquid cooling system 200 can also be implemented according to aspects of the present disclosure. For example, the computing system 100 may include multiple computing devices 120 all mounted in the rack 110, and the liquid cooling system 200 is used to remove heat from one or more heat-generating electronic components 122 of each of the computing devices 120. In another example, the computing system 100 may include a separate liquid cooling system 200 for each computing device 120 and/or each heat-generating electronic component 122. In a further example, the liquid cooling system 200 includes a cold plate 210 and a valve 230 for each computing device 120 and/or each heat-generating electronic component 122, and a single heat removal unit 250 to which all of the valves 230 are coupled to.

Figure 3:
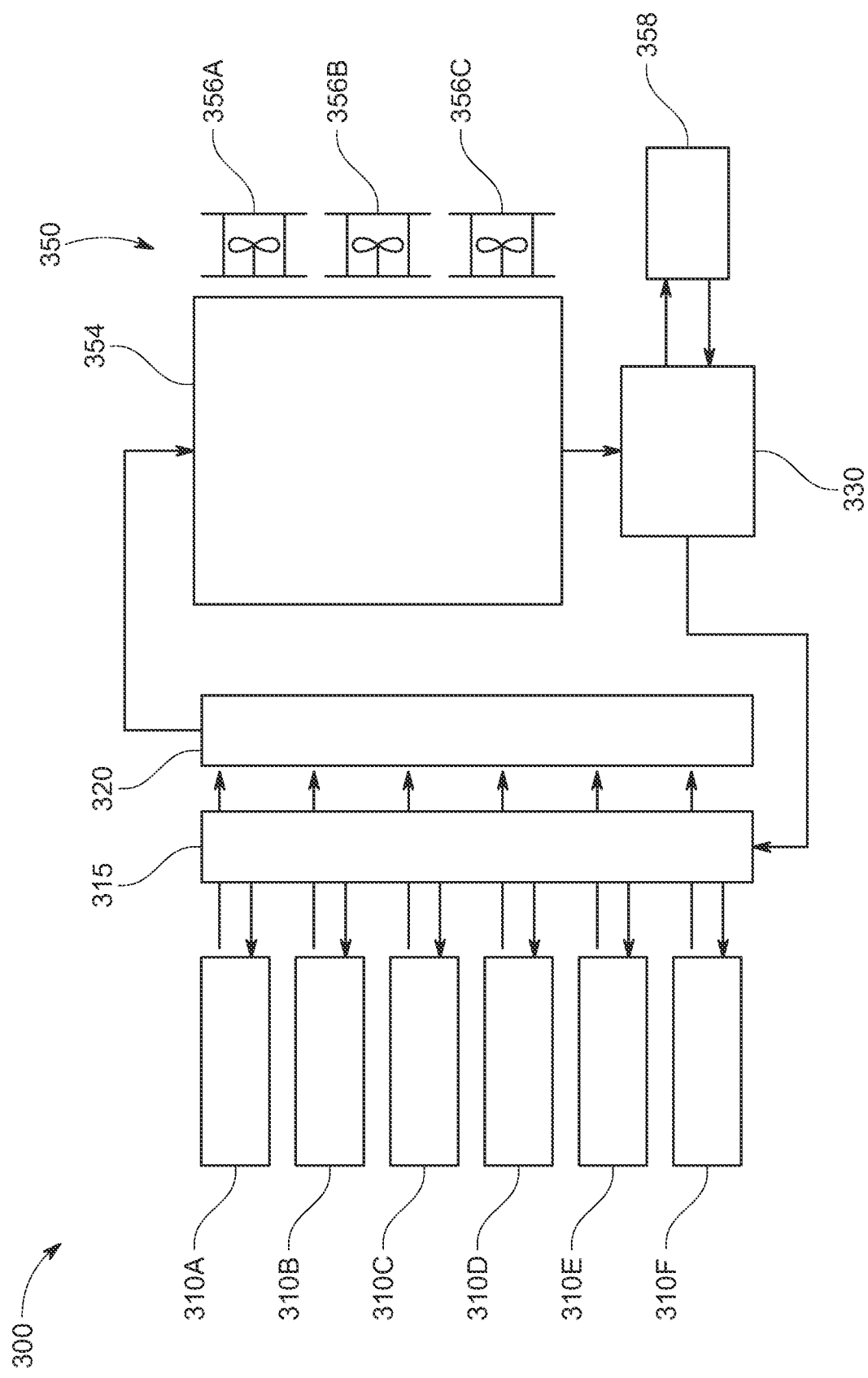
FIG. 3 is a diagram of a second implementation of the liquid cooling system of FIG. 1, according to aspects of the present disclosure.

FIG. 3 shows an example implementation of a liquid cooling system 300 that includes a plurality of cold plates 310A-310F, a first manifold 315, a second manifold 320, a valve 330, and a heat removal unit 350. The first manifold 315 is fluidly coupled to each of the cold plates 310A-310F and the valve 330, such that the cold plates 310A-310F are each fluidly coupled to the valve 330. The second manifold 320 is fluidly coupled to each of the cold plates 310A-310F and the heat removal unit 350. The heat removal unit 350 includes a radiator 354 and a fluid pump 358. The radiator 354 is coupled to the second manifold 320 and the valve 330, while the fluid pump 358 is coupled to the valve 330.

The fluid pump 358 causes the cooling fluid to circulate through the liquid cooling system 300. During operation of the liquid cooling system 300, the cooling fluid flows into either the first manifold 315 or the second manifold 320, and then into each of the cold plates 310A-310F. Similar to the cold plate 210, each of the cold plates 310A-310F will generally include an internal fluid pathway that is fluidly coupled to the first manifold 315 and the second manifold 320, and can be in contact with a heat-generating electronic component. Each cold plate 310A-310F can be in contact with a distinct heat-generating electronic component, or a heat-generating electronic component can be shared between at least two of the cold plates 310A-310F. In either case, the cold plates 310A-310F absorb heat from the heat-generating electronic components. That heat is absorbed by the cooling fluid as it flows through the cold plates 310A-310F, such that the cooling fluid heats up.

The heated cooling fluid then flows into either the second manifold 320 or the first manifold 315, and then eventually through the radiator 354 of the heat removal unit 350. As the heated cooling fluid flows through the radiator 354, the heat removal devices 356A-356C remove heat from the heated cooling fluid (and/or from the material of the radiator 354, which may absorb some of the heat from the heated cooling fluid). In some implementations, the heat removal devices 356A-356C are fans. However, other types of heat removal devices can also be used. Moreover, while three heat removal devices 356A-356C are shown, any suitable number of heat removal devices can be used. The now-cooled cooling fluid can then again flow back into the cold plates 310A-310F via the first manifold 315 or the second manifold 320.

The valve 330 operates in a generally identical fashion to the valve 230 of the liquid cooling system 200, and can be moved between a first orientation and a second orientation. When the valve 330 is in the first orientation and the plurality of cold plates 310A-310F are coupled to the radiator 354 and the fluid pump 358 in a first configuration, the valve 330 fluidly couples an inlet of the fluid pump 358 to the radiator 354, and fluidly couples an outlet of the fluid pump 358 to the first manifold 315. During operation of the liquid cooling system 300 with the valve 330 in the first orientation, the fluid pump 358 receives cooling fluid from the radiator 354 and directs that cooling fluid toward the first manifold 315. The cooling fluid thus flows in a first direction through the internal fluid pathways of the cold plates 310A-310F, from the first manifold 315 to the second manifold 320, when the valve 330 is in the first orientation. Thus, when the valve 330 is in the first orientation, the first manifold 315 receives cooled cooling fluid from the valve 330 and is the cold manifold, and the second manifold 320 receives heated cooling fluid from the cold plates 310A-310F and is the hot manifold.

When the valve 330 is moved to the second orientation and the plurality of cold plates 310A-310F are coupled to the radiator 354 and the fluid pump 358 in a second configuration, the valve 330 fluidly couples the inlet of the fluid pump 358 to the first manifold 315, and fluidly couples the outlet of the fluid pump 358 to the radiator 354. During operation of the liquid cooling system 300 with the valve 330 in the second orientation, the fluid pump 358 receives cooling fluid from the first manifold 315 and directs that cooling fluid toward the radiator 354. The cooling fluid thus flows in a second direction through the internal fluid pathways of the cold plates 310A-310F, from the second manifold 320 to the first manifold 315, when the valve 330 is in the second orientation. Thus, when the valve 330 is in the second orientation, the second manifold 320 receives cooled cooling fluid from the radiator 354 and is the cold manifold, and the first manifold 315 receives heated cooling fluid from the cold plates 310A-310F and is the hot manifold.

The internal fluid pathway of each of the cold plates 310A-310F can be similar to the internal fluid pathway of the cold plate 210 of the liquid cooling system 200, Thus, each of the cold plates 310A-310F can have a first channel coupled to the first manifold 315, a second channel coupled to the second manifold 320, and one or more intermediate channels that connect the first channel and the second channel. When the valve 330 is in the first orientation, the cooling fluid flows from the first channel to the second channel through the one or more intermediate channels. When the valve 330 is in the second orientation, the cooling fluid flows from the second channel to the first channel through the one or more intermediate channels.

The radiator 354 and the pump 358 form the heat removal unit 350 of the liquid cooling system 300, even though the valve 330 is fluidly coupled between the radiator 354 and the pump 358. However, unlike the liquid cooling system 200 where the heat removal unit 250 receives heated cooling fluid via the hot port 252A and delivers cooled cooling fluid via the cold port 252B, the hot and cold ports of the heat removal unit of the liquid cooling system will change depending on the orientation of the valve 330. During normal operation of the liquid cooling system 300 when the valve 330 is in the first orientation, the hot port of the heat removal unit of the liquid cooling system 300 is the end of the radiator 354 that is fluidly coupled to the second manifold 320, and the cold port of the heat removal unit of the liquid cooling system 300 is the end of the fluid pump 358 that is fluidly connected to the first manifold 315 via the valve 330. When the valve 330 is in the second orientation, the hot port of the heat removal unit of the liquid cooling system 300 is the end of the fluid pump 358 that is fluidly connected to the first manifold 315 (which now receives heated cooling fluid from the cold plates 310A-310F because the valve 330 has changed orientations), and the cold port of the heat removal unit of the liquid cooling system 300 is the end of the radiator 354 that is fluidly coupled to the second manifold 320 (which now delivers cooled cooling fluid to the cold plates 310A-310F because the valve 330 has changed orientations). Thus, even though the radiator 354 and the fluid pump 358 are arranged differently than the radiator 254 and the fluid pump 258, the heat removal unit of the liquid cooling system 300 is configured to deliver cooling fluid to the cold plates 310A-310C via the cold port, and is configured to receive heated cooling fluid via the hot port.

Similar to the valve 230, the valve 330 can generally have any arrangement of internal channels (not shown) that are needed to fluidly couple the fluid pump 358 to the proper components. For example, in some implementations, the valve 330 has a first set of internal channels that fluidly couples (i) the first end of the fluid pump 358 to the radiator 354, and (ii) the second end of the fluid pump 358 to the first manifold 315; and a second set of internal channels that fluidly couple (i) the first end of the fluid pump 358 to the first manifold 315, and (ii) the second end of the fluid pump 358 to the radiator 354. Moving between the two orientations can disconnect or disengage the unused set of channels. In other implementations, the valve 330 only has one set of internal channels, and moving the valve 330 between the two orientations causes the internal channels to change shape in order to fluidly couple the first manifold 315, the radiator 354, and the fluid pump 358 as needed.

Some of the components of the liquid cooling system 300 are arranged differently than the components of the liquid cooling system 200. For example, in the liquid cooling system 200, the valve 230 is shown as having ports 234A and 234B coupled to the heat removal unit 250, and ports 232A and 232B coupled to the cold plate 210. But in the liquid cooling system 300, the valve 330 is shown as having only one port coupled to the radiator 354 and one port coupled to the first manifold 315, and then having two ports coupled to the fluid pump 358. Similarly, in the liquid cooling system 200, the fluid pump 258 has one end coupled to the radiator 254 and the other end coupled to port 234B of the valve 230. But in the liquid cooling system 300, the fluid pump 358 has both ends coupled only to the valve 330.

Due to the different arrangements of the components, the liquid cooling systems 200 and 300 demonstrate different ways to position the valve 230/330 relative to the other components to cause the cooling fluid to flow through the cold plates 210/310A-310F in different directions. In the liquid cooling system 200, both the cold plate 210 and the heat removal unit 250 are always fluidly coupled to the same two ports on the valve 230. The inlet of the fluid pump 258 is always fluidly coupled to the radiator 254, and the outlet of the fluid pump 258 is always coupled to the valve 230. Moving the valve 230 between the first orientation and the second orientations changes which ports cold plate 210 that the inlet of the radiator 254 and the outlet of the fluid pump 258 are fluidly coupled to.

In contrast, in the liquid cooling system 300, the inlet of the radiator 354 is always fluidly coupled to the second manifold 320, and the outlet of the fluid pump 358 is always coupled to the valve 330. Moving the valve 330 between the first orientation and the second orientation changes what components the inlet and the outlet of the fluid pump 358 are fluidly coupled to. When the valve 330 is in the first orientation, the inlet of the fluid pump 358 is fluidly coupled to the radiator 354 and the outlet of the fluid pump 354 is fluidly coupled to the first manifold 315. When the valve 330 is in the second orientation, the inlet of the fluid pump 358 is fluidly coupled to the first manifold 315 and the outlet of the fluid pump 354 is fluidly coupled to the radiator 354.

In general however, both the liquid cooling systems 200 and 300 could be modified to be more similar to the other, so long as the respective valve 230, 330 can be moved between two different orientations to cause the cooling fluid to flow through the cold plate 210 or the cold plates 310A-310F in different directions. For example, the liquid cooling system 200 could be modified to work with multiple cold plates by connecting the tube 220A to one manifold (hot or cold) and connecting the tube 220B to another manifold (cold or hot). Both of the manifolds would then be connected to each of the plurality of cold plates, such that the valve 230 would still be operable to change the direction of the flow of the cooling fluid through the manifolds and the cold plates. Similarly, the liquid cooling system 300 could be modified to work with a single cold plate by connecting the valve 330 directly to the cold plate instead of to the first manifold 315, and connecting the radiator 354 directly to the cold plate instead of the second manifold 320, such that the valve 230 would still be operable to change the direction of the flow of the cooling through the cold plate.

In general, any portion of the liquid cooling systems 200 and 300 may be mounted in the rack 110. For example, the cold plate 210 may be mounted in the rack 110 and thermally coupled to the heat-generating electronic component, while the valve 230 and the heat removal unit 250 are mounted outside of and adjacent to the rack 110. In another example, the valve 230 and the heat removal unit 250 can be mounted inside the rack 110 as well. With respect to the liquid cooling system 300, the cold plates 310A-310F, the first manifold 315, and the second manifold 320 can all be integrated into the rack 110, while the valve 330 and the heat removal unit 350 are mounted outside of and adjacent to the rack 110. The valve 330 and the heat removal unit 350 could also be mounted inside the rack 110 as well.

Figure 4:
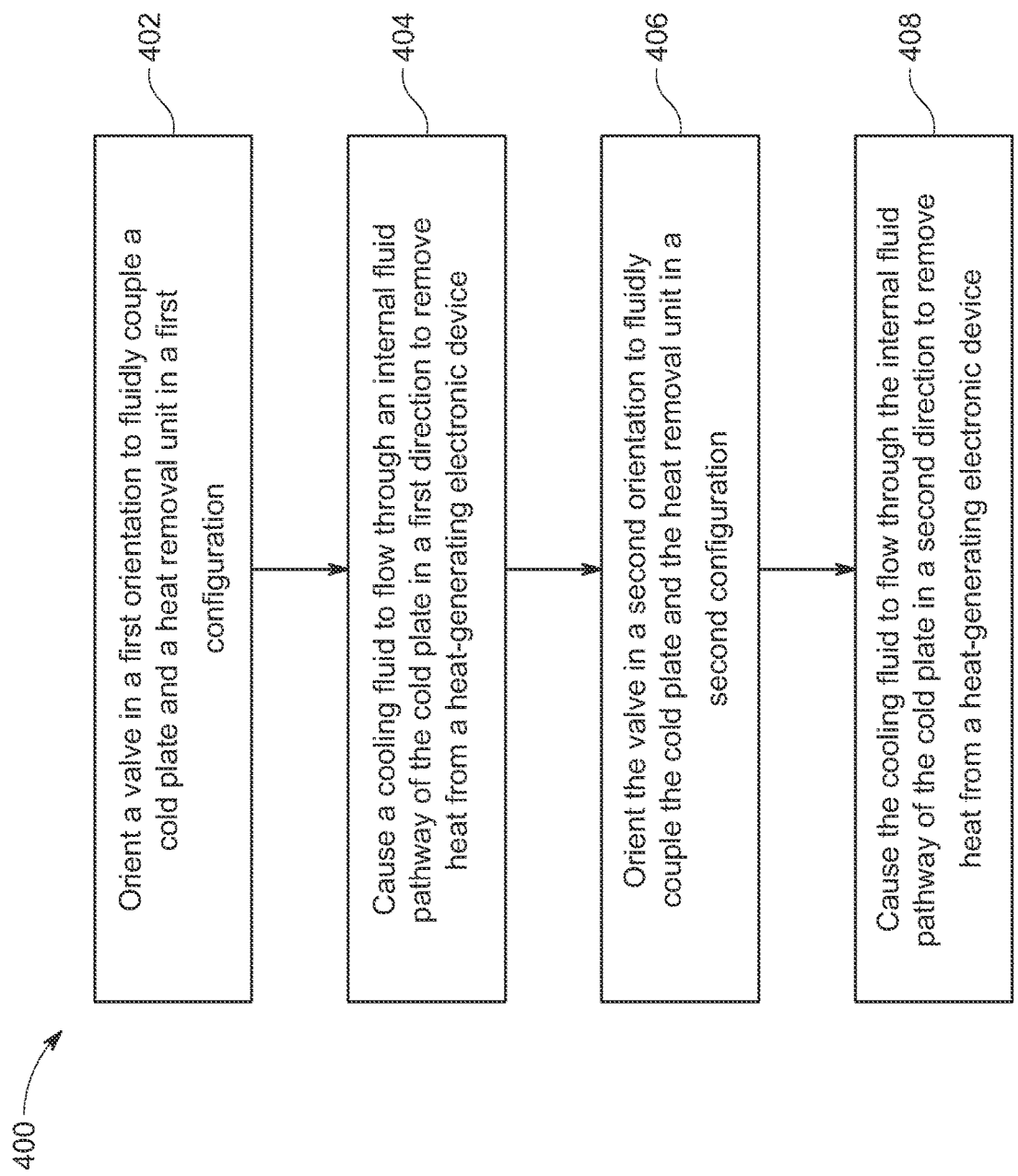
FIG. 4 is a flowchart of a method for cooling the heat-generating electronic component of the computing system of FIG. 1, according to aspects of the present disclosure.

FIG. 4 shows a flowchart of a method 400 for cooling one or more heat-generating electronic components (such as one or more of the heat-generating electronic component 122). Method 400 can be implemented using a liquid cooling system (such as the liquid cooling system 200 or the liquid cooling system 300) that includes one or more cold plates (such as the cold plate 210 or the cold plates 310A-310F), a valve (such as the valve 230 or the valve 230), and a heat removal unit (such as the heat removal unit 250 or the heat removal unit 350). Step 402 of the method 400 includes orienting the valve in a first orientation to fluidly couple the one or more cold plates and the heat removal unit in a first configuration. In some implementations, the liquid cooling system is arranged as shown in FIG. 2A when the valve is in the first orientation after step 402.

Step 404 of the method 400 includes causing a cooling fluid to flow through an internal fluid pathway of each of the one or more cold plates in a first direction, to remove heat from the one or more heat-generating electronic components. As the cooling fluid flows into and through the one or more cold plates, the cooling fluid absorbs heat from the one or more heat-generating electronic components and heats up. The heated cooling fluid flows through the heat removal unit, which removes heat from the cooling fluid. The now-cooled cooling fluid can again flow into and through the one or more cold plates to continue removing heat.

Step 406 of the method 400 includes orienting the valve in a second orientation to fluidly couple the one or more cold plates and the heat removal unit in a second configuration. In some implementations, the liquid cooling system is arranged as shown in FIG. 2B when the valve is in the second orientation after step 406.

Step 408 of the method 400 includes causing a cooling fluid to flow through the internal fluid pathway of each of the one or more cold plates in a second direction, to remove heat from the one or more heat-generating electronic components. As the cooling fluid flows into and through the one or more cold plates, the cooling fluid absorbs heat from the one or more heat-generating electronic components and heats up. The heated cooling fluid flows through the heat removal unit, which removes heat from the cooling fluid. The now-cooled cooling fluid can again flow into and through the one or more cold plates to continue removing heat. However, the cooling fluid flows through the internal fluid pathway of each of the one or more cold plates in the opposite direction in step 408 as compared to the direction in step 404. Additionally, causing the cooling fluid to flow in the opposite direction through the internal fluid pathway of each of the one or more cold plates will aid in removing any accumulated dirt, dust, or other debris within the one or more cold plates.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A liquid cooling system comprising:
    a cold plate configured to be thermally coupled to a heat-generating electronic component, the cold plate having an internal fluid pathway through which a cooling fluid flows;
    a heat removal unit fluidly coupled to the cold plate and configured to deliver the cooling fluid to the cold plate, receive heated cooling fluid from the cold plate, and remove heat from the heated cooling fluid;
    a valve fluidly coupled to the cold plate and the heat removal unit, the valve being operable between a first orientation and a second orientation, the valve being positioned outside the internal fluid pathway;
    a radiator having an input and an output, the radiator being configured to receive the heated cooling fluid from the cold plate at the input and deliver the cooling fluid to the cold plate from the output; and
    a fluid pump directly coupled to the valve for both (i) flow to and (ii) flow from the valve, the fluid pump being configured to indirectly cause the cooling fluid to flow into the radiator, via the valve, (a) from the cold plate through the radiator and (b) from the radiator to the cold plate;

wherein when the valve is in the first orientation, the cold plate and the heat removal unit are fluidly coupled in a first configuration in which the cooling fluid flows through the internal fluid pathway of the cold plate in a first direction;

wherein when the valve is in the second orientation, the cold plate and the heat removal unit are fluidly coupled in a second configuration in which the cooling fluid flows through the internal fluid pathway of the cold plate in a second direction different than the first direction, wherein the cold plate includes a first port disposed at a first end of the internal fluid pathway, and a second port disposed at a second end of the internal fluid pathway;

wherein the internal fluid pathway of the cold plate includes a first channel in fluid communication with the first port, a second channel in fluid communication with the second port, and one or more intermediate channels in fluid communication with the first channel and the second channel; and wherein when the valve is in the first orientation, the cooling fluid flows through the one or more intermediate channels in a first direction, and wherein when the valve is in the second orientation, the cooling fluid flows through the one or more intermediate channels in a second direction that is opposite the first direction.

2. The liquid cooling system of claim 1, wherein the heat removal unit includes a cold port and a hot port, the heat removal unit being configured to deliver the cooling fluid to the cold plate via the cold port, the heat removal unit being further configured to receive the heated cooling fluid from the cold plate via the hot port.

3. The liquid cooling system of claim 2, wherein when the valve is in the first orientation, the cold port of the heat removal unit is fluidly coupled to the first port of the cold plate, and the hot port of the heat removal unit is fluidly coupled to the second port of the cold plate.

4. The liquid cooling system of claim 2, wherein when the valve is in the second orientation, the cold port of the heat removal unit is fluidly coupled to the second port of the cold plate, and the hot port of the heat removal unit is fluidly coupled to the first port of the cold plate.

5. The liquid cooling system of claim 1 in combination with a rack and a computing device mounted in the rack, the computing device including the heat-generating electronic component.

6. The liquid cooling system of claim 1, wherein the heat removal unit includes
one or more heat removal devices configured to remove the heat from the heated cooling fluid as the heated cooling fluid flows through the radiator.

7. A liquid cooling system comprising:
a plurality of cold plates each configured to be thermally coupled to at least one of one or more heat-generating electronic components, each of the plurality of cold plates having an internal fluid pathway through which a cooling fluid flows;
a first manifold fluidly coupled to a first end of the internal fluid pathway of each of the plurality of cold plates;
a second manifold fluidly coupled to a second end of the internal fluid pathway of each of the plurality of cold plates;
a heat removal unit fluidly coupled to the plurality of cold plates and configured to deliver the cooling fluid to the plurality of cold plates, receive heated cooling fluid from the plurality of cold plates, and remove heat from the heated cooling fluid;
a valve fluidly coupled to the first manifold and the second manifold, the valve being operable between a first orientation and a second orientation, the valve being positioned outside the internal fluid pathway;
a radiator having an input and an output, the radiator being configured to receive the heated cooling fluid from the plurality of cold plates at the input and deliver the cooling fluid to the plurality of cold plates from the output; and
a fluid pump directly coupled to the valve for both (i) flow to and (ii) flow from the valve, the fluid pump being configured to indirectly cause the cooling fluid to flow into the radiator, via the valve, (a) from the plurality of cold plates through the radiator and (b) from the radiator to plurality of cold plates;

wherein when the valve is in the first orientation, the heat removal unit delivers the cooling fluid to the plurality of cold plates via the first manifold and receives the heated cooling fluid from the plurality of cold plates via the second manifold, such that the cooling fluid flows through the internal fluid pathway of the cold plate in a first direction;

wherein when the valve is in the second orientation, the heat removal unit delivers the cooling fluid to the plurality of cold plates via the second manifold and receives the heated cooling fluid from the plurality of cold plates via the first manifold, such that the cooling fluid flows through the internal fluid pathway of the cold plate in a second direction different than the first direction;

wherein the internal fluid pathway of each of the plurality of cold plates includes a first channel, a second channel, and one or more intermediate channels connecting the first channel and the second channel, and wherein within each of the plurality of cold plates:
when the valve is in the first orientation, the cooling fluid flows from the first channel to the second channel through the one or more intermediate channels, and
when the valve is in the second orientation, the cooling fluid flows from the second channel to the first channel through the one or more intermediate channels.

8. The liquid cooling system of claim 7, wherein the heat removal unit includes a cold port and a hot port, the fluid pump being configured to cause the cooling fluid to be delivered to the plurality of cold plates via the cold port, and to cause the heated cooling fluid to be received from the plurality of cold plates via the hot port.

9. The liquid cooling system of claim 8, wherein when the valve is in the first orientation, the fluid pump is configured to cause the cooling fluid to flow from the cold port to the plurality of cold plates through the first manifold, and to cause the heated cooling fluid to flow from the plurality of cold plates to the hot port through the second manifold.

10. The liquid cooling system of claim 9, wherein the cooling fluid is configured to flow from the cold port and through the valve prior to flowing through the first manifold.

11. The liquid cooling system of claim 8, wherein when the valve is in the second orientation, the fluid pump is configured to cause the cooling fluid to flow from the cold port to the plurality of cold plates through the second manifold, and to cause the heated cooling fluid to flow from the plurality of cold plates to the heat removal unit through the first manifold.

12. The liquid cooling system of claim 11, wherein the heated cooling fluid is configured to flow from the first manifold and through the valve prior to flowing to the heat removal unit.

13. The liquid cooling system of claim 7 in combination with a rack and one or more computing devices mounted in the rack, the one or more computing devices including the one or more heat-generating electronic components.

14. A method for cooling one or more heat-generating electronic components, the method comprising:
- receiving a heated cooling fluid from one or more cold plates at a radiator input;
- delivering a cooling fluid to the one or more cold plates at a radiator output;
- causing (i) flow to and (ii) flow from a valve via a fluid pump that is directly coupled to the valve;
- indirectly causing the cooling fluid to flow into the radiator, via the valve, (a) from the one or more cold plates through the radiator and (b) from the radiator to the one or more cold plates;
- orienting a valve in a first orientation to fluidly couple the one or more cold plates and a heat removal unit in a first configuration;
- causing the cooling fluid to flow through an internal fluid pathway of each of the one or more cold plates in a first direction to remove heat from the one or more heat-generating electronic components, the internal fluid pathway of each of the plurality of cold plates including a first channel, a second channel, and one or more intermediate channels connecting the first channel and the second channel, the internal fluid pathway excluding the valve;
- causing the cooling fluid to flow in the first orientation from the first channel to the second channel through the one or more intermediate channels;
- orienting the valve in a second orientation different from the first orientation to fluidly couple the one or more cold plates and the heat removal unit in a second configuration; and
- causing the cooling fluid to flow through the internal fluid pathway of each of the one or more cold plates in a second direction different from the first direction to remove heat from the one or more heat-generating electronic components;
- causing the cooling fluid to flow in the second orientation from the second channel to the first channel through the one or more intermediate channels.

* * * * *